(12) United States Patent
Hatchard

(10) Patent No.: US 6,320,266 B1
(45) Date of Patent: Nov. 20, 2001

(54) TECHNIQUE FOR REDUCING BREAKAGE OF THINNED FLIP-CHIP MULTI-LAYER INTEGRATED CIRCUIT DEVICES

(75) Inventor: Colin Hatchard, Campbell, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/273,227

(22) Filed: Mar. 18, 1999

(51) Int. Cl.[7] .................................................. H01L 23/48
(52) U.S. Cl. .............................................................. 257/778
(58) Field of Search ............................................... 257/778

(56) References Cited

U.S. PATENT DOCUMENTS

| | | | | |
|---|---|---|---|---|
| 5,476,566 | * | 12/1995 | Casavin ................................. 156/249 |
| 5,607,099 | * | 3/1997 | Yeh et al. ......................... 228/180.22 |
| 5,872,365 | * | 2/1999 | Goh et al. ........................... 250/492.1 |
| 6,168,960 | * | 1/2001 | Li ............................................ 438/14 |

OTHER PUBLICATIONS

Lasers Society 8th Annual Meeting, vol. 1, IEEE, vol. 2 1995, "A room temperature Flip–Chip Mounting Technique for Laser Diodes on Si Motherboard".*

* cited by examiner

Primary Examiner—Stephen D. Meier
Assistant Examiner—James Mitchell
(74) Attorney, Agent, or Firm—Sawyer Law Group LLP

(57) ABSTRACT

Aspects for supporting thinning of a flip-chip device with reduced risk of breakage are described. An exemplary apparatus aspect includes a multi-layer integrated circuit device oriented in a flip-chip orientation, and a support substrate transparent to a light source of a predetermined wavelength. The apparatus further includes an adhesive, the adhesive affixing the multi-layer integrated circuit device to the support structure during thinning of the multi-layer integrated circuit device from a backside and sufficiently releasing the multi-layer integrated circuit device when exposed to the light source of the predetermined wavelength through the support substrate after thinning is completed to reduce breakage risk for the thinned multi-layer integrated circuit device.

2 Claims, 2 Drawing Sheets

TECHNIQUE FOR REDUCING BREAKAGE OF THINNED FLIP-CHIP MULTI-LAYER INTEGRATED CIRCUIT DEVICES

FIELD OF THE INVENTION

The present invention relates to multi-layer integrated circuit (IC) devices, and more particularly to reducing breakage risk of thinned multi-layer ICs for device deprocessing.

BACKGROUND OF THE INVENTION

For flip-chip, multi-layer IC devices, debugging for defects in the IC is difficult due to having to approach the desired layers from the backside of the device. FIG. 1 illustrates a sideview block diagram of a typical flip-chip configuration. As shown in FIG. 1, an IC device 10 is coupled to a ceramic package 12 (e.g., a C4 package) via solder bumps 14. The solder bumps 14 act as chip-to-carrier interconnects to attach the IC device 10 to the ceramic package 12 and to mate with corresponding pad patterns to form the necessary electrical contacts between the circuit(s) of the IC device 10 and pins of the package 12.

Device analysis remains a challenge due to the upside-down nature of the flip-chip orientation. Thus, device deprocessing of flip-chip oriented IC devices faces several difficulties. Normal deprocessing utilizes mechanical polishing of the thick silicon backside layer in order to more readily access the circuit features at the frontside layers. The mechanical polishing used from the backside removes the silicon and creates a very thin device. The reduced thickness allows utilization of an infrared (IR) optical device to view the device. A support structure typically holds the device during the thinning process. Once thinned, the device then requires removal from the support before the deprocessing procedure continues. Unfortunately, the thin device created by polishing is difficult to handle and subsequently utilize in further device analysis, which normally requires multiple steps for the removal of the device from the support to perform well-established delayering techniques from a frontside of the device. Breakage of the device often occurs due to the thinness of the device and brittleness of the silicon. Thus, the process is highly problematic and significantly time-consuming.

Accordingly, a need exists for a technique that reduces the risk of breakage when handling thinned dies. The present invention addresses such a need.

SUMMARY OF THE INVENTION

The present invention provides aspects for supporting thinning of a flip-chip device with reduced risk of breakage. An exemplary apparatus aspect includes a multi-layer integrated circuit device oriented in a flip-chip orientation, and a support substrate transparent to a light source of a predetermined wavelength. The apparatus further includes an adhesive, the adhesive affixing the multi-layer integrated circuit device to the support structure during thinning of the multi-layer integrated circuit device from a backside and sufficiently releasing the multi-layer integrated circuit device when exposed to the light source of the predetermined wavelength through the support substrate after thinning is completed to reduce breakage risk for the thinned multi-layer integrated circuit device.

Through the present invention, less risk of breakage of thinned flip-chip devices is efficiently achieved. The straightforward and innovative utilization of a light-sensitive adhesive and corresponding transparent support structure successfully avoids problems associated with typical device removal techniques. These and other advantages of the aspects of the present invention will be more fully understood in conjunction with the following detailed description and accompanying drawings.

DETAILED DESCRIPTION

Figure 1:
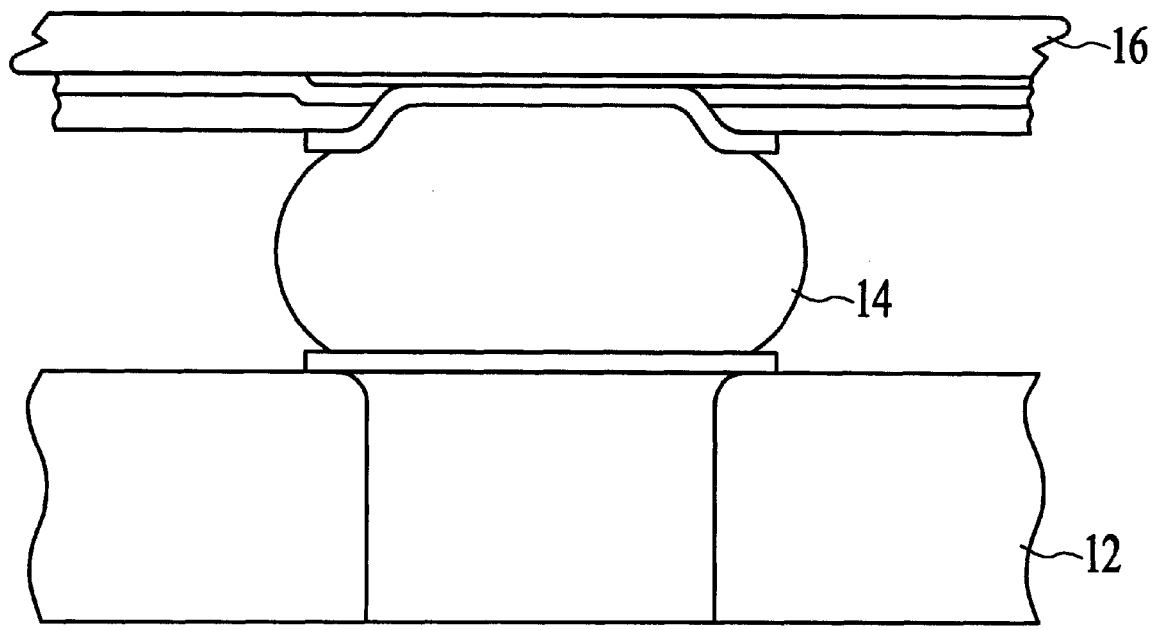
FIG. 1 illustrates a representation of a sideview of a typical flip-chip multi-layer integrated circuit.
Figure 2:
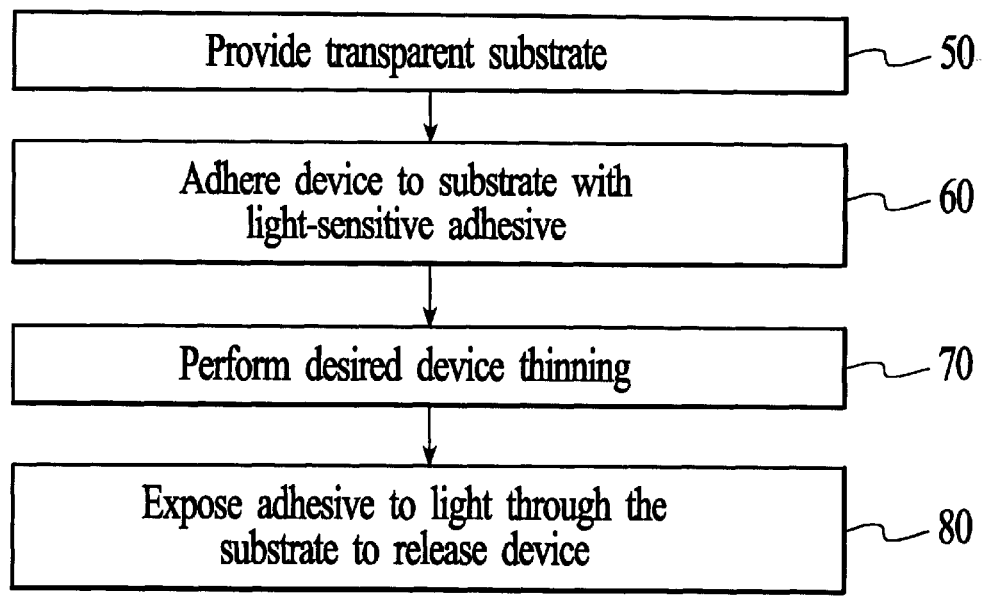
FIG. 2 illustrates a flow diagram of utilizing a light-sensitive adhesive to reduce breakage of thinned devices in accordance with the present invention.
Figure 3:
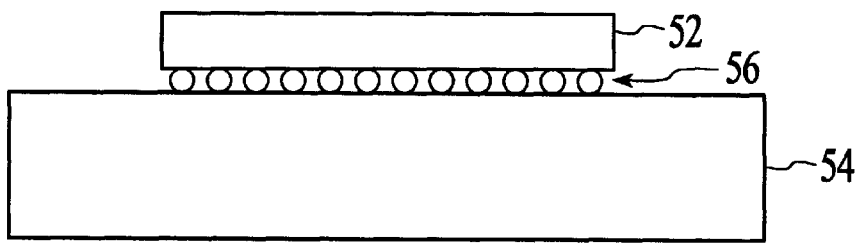
FIG. 3 illustrates a sideview representation of a device adhered to a support substrate in accordance with step 60, FIG. 2.

The present invention relates to utilizing light-sensitive adhesive to reduce breakage of multi-layer integrated circuit flip-chip devices for deprocessing. The following description is presented to enable one of ordinary skill in the art to make and use the invention and is provided in the context of a patent application and its requirements. Various modifications to the preferred embodiment and the generic principles and features described herein will be readily apparent to those skilled in the art:

Standard practices for flip-chip device deprocessing generally involve thinning of the flip-chip device from the backside in order to more readily access the circuit features at a frontside of the device. The present invention enhances the procedures and effectively reduces breakage problems associated with standard techniques. The process, as illustrated in the flow diagram of FIG. 2, initiates with provision of a support substrate for the device that is transparent to light of a predetermined wavelength (step 50), e.g., a glass substrate that allows ultraviolet (UV) light to pass through. Preferably, having had the majority of its ceramic package outside of the device area cut away to more readily isolate the device, the device is then adhered to the support substrate with an adhesive that is sensitive to light of the predetermined wavelength (step 60), e.g., glue that is sensitive to UV light. FIG. 3 illustrates the device 52 adhered to a UV transparent support substrate 54 via UV-sensitive glue 56. By way of example, UV-sensitive glues are known and used in tape products for wafers, such as UV-Tape products available from Furukawa Electric Co., Ltd.

Figure 4:
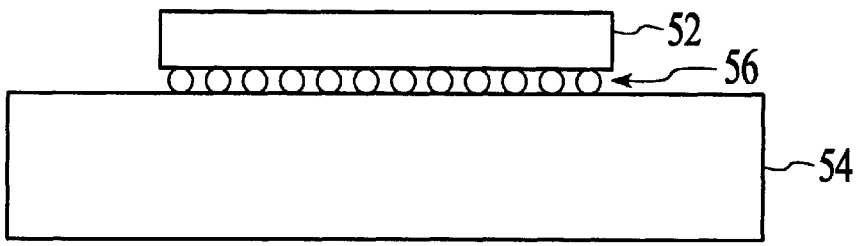
FIG. 4 illustrates a sideview of FIG. 3 for step 80 of FIG. 2.

With the substrate attached, the device is ready for thinning using standard thinning techniques (step 70), i.e., mechanical polishing of the device on a polishing wheel, as is well understood by those skilled in the art. Since the substrate 54 acts as a support during the thinning process, the chosen glue 56 preferably provides enough adhesiveness to properly hold the device 52 in place during the polishing. FIG. 4 illustrates the device 52 where the thickness of the backside silicon layer has been reduced to the desired thickness.

Once the desired thickness is achieved, the device 52 is ready for removal from the support substrate 54 for further deprocessing. Thus, in accordance with the present invention, light of the predetermined wavelength, e.g., UV, is transmitted through the support substrate 54 (step 80), as represented by the arrows 58 in FIG. 4. Suitably, the light is transmitted for a time period sufficient to release the device. With the UV light transmitted through the support substrate 54, the UV light-sensitive glue 56 changes in adhesive quality sufficiently to release the device 52 from the support substrate 54. Thus, the device is readily separated from the support structure with reduced risk of breakage to allow further deprocessing, since the removal of the thinned device does not require overcoming the full force of the adhesive.

Although the present invention has been described in accordance with the embodiments shown, one of ordinary skill in the art will recognize that there could be variations to the embodiment and those variations would be within the spirit and scope of the present invention. For example, although the present invention has been described in terms of silicon based ICs, flip-chip ICs formed with other substrates may be processed using suitable processing conditions for those substrates in accordance with the aspects described herein. Accordingly, many modifications may be made by one of ordinary skill without departing from the spirit and scope of the present invention, the scope of which is defined by the following claims.

What is claimed is:

1. An apparatus for supporting thinning of a flip-chip device with reduced risk of breakage, the apparatus comprising:
   - a multi-layer integrated circuit device oriented in a flip-chip orientation;
   - a support substrate transparent to a light source of a predetermined wavelength; and
   - an adhesive, the adhesive affixing the multi-layer integrated circuit device to the support structure during thinning of the multi-layer integrated circuit device from a backside and sufficiently releasing the multi-layer integrated circuit device when exposed to the light source through the support substrate after thinning is completed to reduce breakage risk for the thinned multi-layer integrated circuit device, wherein the light source comprises an ultraviolet light source, and further wherein the adhesive comprises a glue that changes sufficiently in adhesive capability when exposed to ultraviolet light from the ultraviolet light source to release the multi-layer integrated circuit device.

2. The apparatus of claim 1 wherein the support substrate comprises glass.

* * * * *